United States Patent
Ni et al.

(10) Patent No.: US 11,328,926 B2
(45) Date of Patent: May 10, 2022

(54) ULTRALOW DIELECTRIC MESOPOROUS ORGANOSILICON FILM AND PREPARATION METHOD THEREOF

(71) Applicant: HUAIYIN INSTITUTE OF TECHNOLOGY, Huaian (CN)

(72) Inventors: Lingli Ni, Huaian (CN); Yongtao Liu, Huaian (CN); Tao Xie, Huaian (CN); Minhua Xu, Huaian (CN); Zhitian Chen, Huaian (CN); Peng Chai, Huaian (CN); Xiaoyan Gao, Huaian (CN); Liang Dong Feng, Huaian (CN); Shizhong Zhang, Huaian (CN)

(73) Assignee: HUAIYIN INSTITUTE OF TECHNOLOGY, Huaian (CN)

( * ) Notice: Subject to any disclaimer, the term of this patent is extended or adjusted under 35 U.S.C. 154(b) by 29 days.

(21) Appl. No.: 16/771,158

(22) PCT Filed: Oct. 9, 2018

(86) PCT No.: PCT/CN2018/109446
§ 371 (c)(1),
(2) Date: Jun. 9, 2020

(87) PCT Pub. No.: WO2020/042284
PCT Pub. Date: Mar. 5, 2020

(65) Prior Publication Data
US 2021/0175074 A1    Jun. 10, 2021

(30) Foreign Application Priority Data

Aug. 28, 2018  (CN) .......................... 201810989493.4

(51) Int. Cl.
*H01L 21/02*     (2006.01)
*C03C 17/30*     (2006.01)
*C07F 7/21*      (2006.01)

(52) U.S. Cl.
CPC ........ *H01L 21/02216* (2013.01); *C03C 17/30* (2013.01); *C07F 7/21* (2013.01);
(Continued)

(58) Field of Classification Search
None
See application file for complete search history.

(56) References Cited

U.S. PATENT DOCUMENTS 6,576,345 B1 *  6/2003  Van Cleemput ............................ H01L 21/02126
428/447
2005/0154150 A1  7/2005  Wei et al.
(Continued)

FOREIGN PATENT DOCUMENTS

| CN | 101250196 A | 8/2008 |
| CN | 101348385 A | 1/2009 |

OTHER PUBLICATIONS

Goto, Ryoto, et al., entitled "A hybrid mesoporous material with uniform distribution of carboxy groups assembled from a cubic siloxane-based precursor", Chemical Communications, 2008, pp. 6152-6154 (Year: 2008).*

(Continued)

*Primary Examiner* — Erik Kielin
(74) *Attorney, Agent, or Firm* — Hauptman Ham, LLP

(57) ABSTRACT

The present invention relates to the field of chemical industry, and discloses organosilicone micro-mesoporous ultralow dielectric thin films and preparation methods therefor. A structural formula of a POSS-based organosilane precursor in the thin film is as follows:

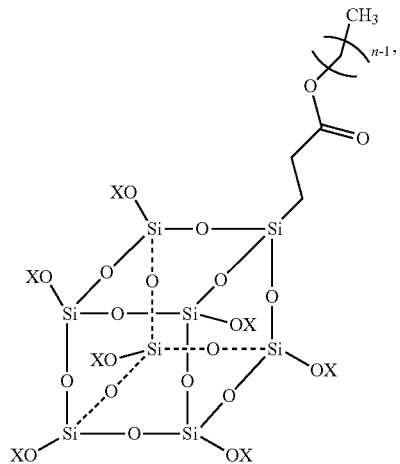

where n is 12, 16, 18, 20, or 22, and X is $CH_3$ or $CH_2CH_3$. The preparation method includes the following steps: dissolving a certain amount of the POSS-based precursor in an organic solvent at a room temperature; adding an appropriate amount of a photoacid generator, after uniformly stirring, spraying a mixed liquid to form a film on a substrate; placing the substrate under a light-emitting diode lamp for irradiating for a preset time after the organic solvent is completely evaporated; then placing the substrate in N,N-dimethylformamide for undergoing a transesterification reaction with fluoroalkyl alcohol for 24-72 h; and washing and drying to obtain the organosilicone micro-mesoporous ultra-low dielectric thin film. Compared with existing ultra-low dielectric thin films, the obtained thin film has a lower dielectric constant (1.89), and is better in dielectric stability in a humid environment, simple to operate, and high in polymerization speed.

9 Claims, No Drawings

(52) U.S. Cl.
CPC .. *H01L 21/02118* (2013.01); *H01L 21/02203* (2013.01); *H01L 21/02282* (2013.01); *C03C 2218/112* (2013.01)

(56) References Cited

U.S. PATENT DOCUMENTS

| | | | | |
|---|---|---|---|---|
| 2008/0076870 | A1* | 3/2008 | Hiraoka | C09D 183/04 524/588 |
| 2011/0245416 | A1* | 10/2011 | Wada | H01L 21/02216 524/849 |
| 2015/0030773 | A1* | 1/2015 | Seshimo | C09D 153/02 427/264 |
| 2018/0175300 | A1* | 6/2018 | Yamamoto | H01L 51/0041 |

OTHER PUBLICATIONS

International Search Report issued in corresponding International Application No. PCT/CN2018/109446, dated Jan. 30, 2019, pp. 1-5, China National Intellectual Property Administration, Beijing, China.
Written Opinion of the International Searching Authority issued in corresponding International Application No. PCT/CN2018/109446, dated Jan. 30, 2019, pp. 1-7, China National Intellectual Property Administration, Beijing, China.

\* cited by examiner

ULTRALOW DIELECTRIC MESOPOROUS ORGANOSILICON FILM AND PREPARATION METHOD THEREOF

RELATED APPLICATIONS

The present application is a U.S. National Phase of International Application Number PCT/CN2018/109446, filed Oct. 9, 2018, and claims the priority of Chinese Application No. 201810989493.4, filed Aug. 28, 2018.

TECHNICAL FIELD

The present invention relates to the technical field of dielectric thin film preparation, and in particular, to organosilicone micro-mesoporous ultra-low dielectric thin films and preparation methods therefor.

BACKGROUND

An ultra-low dielectric constant (κ) thin film is a key new material urgently needed to overcome in the development of microelectronics industry. Because the dielectric constant (κ=1.01) of air is very low, synthesis of a large amount of different porous ultra-low dielectric thin films is reported. However, the introduction of pores results in that mechanical properties of the material are reduced, the mechanical strength of the film is reduced, and heat dissipation performance becomes poor, so that it is difficult to meet actual requirements.

An organosilicone mesoporous molecular sieve not only has good mechanical strength, but also has an ultra-low dielectric constant, which attracts much attention. However, a pore wall structure of the organosilicone mesoporous molecular sieve is still completely disordered from a microscopic viewpoint. The structure reduces the mechanical property and thermal stability of the material, and is easy to absorb moisture, rendering that the dielectric capability of the structure is remarkably reduced in an environment having high humidity, and the development and application of the structure as a low κ material is seriously hindered.

In addition, for the preparation of an organosilicone mesoporous molecular sieve thin film, a current commonly used method is a solvent-evaporation induced self-assembly (EISA) method. According to the method, a traditional sol-gel method and molecule template self-assembly are combined, and a mesoporous material is prepared in a non-aqueous solvent. The method is convenient in operation and easy to control, and particularly has unique advantages in controlling the macro-morphology of mesoporous materials. However, the method requires an expensive template agent in a preparation process, and the number of optional template agents is limited; hole collapse would easily be caused in the process of removing the template agent. The influences of a film preparation condition, a solvent evaporation rate, and a complex silica sol composition on a self-assembly structure are difficult to control.

SUMMARY

Purposes of the invention: with regard to the problems existing in the prior art, the present invention provides organosilicone micro-mesoporous ultra-low dielectric thin films and preparation methods therefor. An obtained organosilicone micro-mesoporous polyorganosiloxane thin film not only has an excellent ultra-low dielectric property, but also has good hydrophobicity, thermal stability and mechanical strength. Moreover, the method is simple in operation, easy to control, fast in polymerization speed, and energy-saving and environment-friendly.

Technical solutions: the present invention provides organosilicone micro-mesoporous ultra-low dielectric thin films. A structural formula of a Polyhedral Oligomeric Silsesquioxane (POSS)-based organosilane precursor in the thin film is as follows:

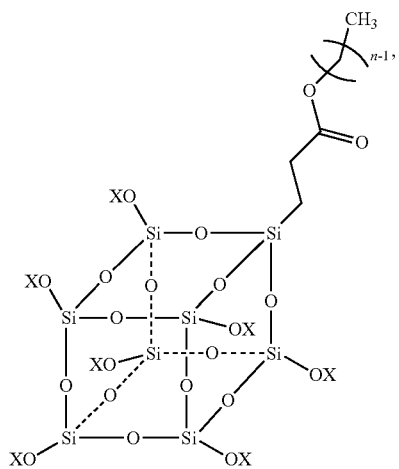

where n is 12, 16, 18, 20, or 22, and X is $CH_3$ or $CH_2CH_3$.

The present invention further provides a preparation method for the organosilicone micro-mesoporous ultra-low dielectric thin film, including the following steps: dissolving the POSS-based precursor in an organic solvent at a room temperature; adding an appropriate amount of a photoacid generator; after uniformly stirring, spraying a mixed liquid to form a film on a substrate; placing the substrate under a light-emitting diode lamp for irradiating for a preset time after the organic solvent is completely evaporated; then placing the substrate in N,N-dimethylformamide (DMF) for undergoing a transesterification reaction with short-chain fluoroalkyl alcohol for 24-72 h; and washing and drying to obtain the organosilicone micro-mesoporous ultra-low dielectric thin film.

Preferably, a mass ratio of the POSS-based precursor to the photoacid generator is 10:0.05-1.

Preferably, a molar concentration of the short-chain fluoroalkyl alcohol is 0.01-0.05 mol/L.

Preferably, a specific wavelength of the light-emitting diode lamp is 320 nm, 365 nm, or 405 nm, and an irradiation time is 30-60 min.

Preferably, power of the light-emitting diode lamp is 0.1 $mW/cm^2$-20 $mW/cm^2$, is preferably 0.5 $mW/cm^2$, 2 $mW/cm^2$, 5 $mW/cm^2$, and 10 $mW/cm^2$.

Preferably, a preset time is 30-60 min, and is preferably 30 min, 45 min, or 60 min.

Preferably, the photoacid generator is 4-isobutyl phenyl-4'-methyl phenyl iodohexafluorophosphate (I250), 2-methyl-α-[2-[[propylsulfonyl]imine]-3(2H)-thiophenmethylene-phenylacetonitrile (PAG103), or 4-octyloxy diphenyl iodonium hexaflurorantimonate (OPHA).

Preferably, the fluoroalkyl alcohol is 2,2,2-trifluoroethanol, 3,3,3-trifluoro-1-propanol, 4,4,4-trifluoro-1-butanol, or 1H,1H,2H,2H-perfluorohexan-1-ol.

Preferably, the substrate is conductive glass or a silicon wafer.

Beneficial effects: according to the present invention, a POSS-based organosilane precursor is used for introducing an intrinsic nano-pore thereof into a thin film; as the POSS has high thermal stability, mechanical strength, good film-forming performance and excellent substrate adhesion, and satisfies requirements of a structure and a composition required by a low dielectric constant material such as a special nano-sized cage-shaped structure (for example, if n=8, a T8 structure approximate to a cub is included, and a pore diameter thereof is 0.53 nm), in combination with features of rapidness and convenience of a photoluminescent sol-gel method, and by means of a transesterification reaction, a fluoroalkyl silicone chain is introduced to a POSS chain; as a mesoporous structure is introduced, the thin film has a stronger hydrophobic property, so that an organosilicone micro-mesoporous ultra-low dielectric thin film having excellent heat resistance and moisture resistance is obtained.

Compared with the prior art, the preparation method provided in the present invention only needs to mix the organosilane precursor and the photoacid generator with an organic solvent, and a formulated solution is very stable under a condition of no illumination; the preparation of a coating only requires simple illumination for 30-60 min and has an advantage of simplicity and high-efficiency; and the ultra-low dielectric thin film in the present invention has excellent heat resistance and moisture resistance, and has a good application prospect in CPU integrated circuits.

DETAILED DESCRIPTION

The present invention is described in details below with reference to specific embodiments.

Embodiment 1

At a room temperature, 0.5 g of a POSS-based precursor (as shown in FIG. 1, n=12, X=$CH_2CH_3$) is dissolved in 5 mL of a tetrahydrofuran solvent; 0.005 g of 4-isobutyl phenyl-4'-methyl phenyl iodohexafluorophosphate (1250) is added; after uniformly stirring, a mixed liquid is sprayed to form a film on a substrate; the substrate is placed under a 320 nm and 0.1 mW/cm$^2$ light-emitting diode lamp for irradiating for 30 min after tetrahydrofuran is completely evaporated; then the substrate is placed in 10 mL of an N,N-DMF solution having 0.05 mol/L of 2,2,2-trifluoroethanol for undergoing a transesterification reaction for 24 h; and washing and drying are performed to obtain an organosilicone micro-mesoporous ultra-low dielectric thin film. See Table 1 for the result.

Embodiment 2

At a room temperature, 0.5 g of a POSS-based precursor (as shown in FIG. 1, n=16, X=$CH_3$) is dissolved in 7 mL of a tetrahydrofuran solvent; 0.01 g of 4-octyloxy diphenyl iodonium hexaflurorantimonate (OPHA) is added; after uniformly stirring, a mixed liquid is sprayed to form a film on a substrate; the substrate is placed under a 365 nm and 0.5 mW/cm$^2$ light-emitting diode lamp for irradiating for 30 min after tetrahydrofuran is completely evaporated; then the substrate is placed in 10 mL of an N,N-DMF solution having 0.05 mol/L of 2,2,2-trifluoroethanol for undergoing a transesterification reaction for 24 h; and washing and drying are performed to obtain an organosilicone micro-mesoporous ultra-low dielectric thin film. See Table 1 for the result.

Embodiment 3

At a room temperature, 0.5 g of a POSS-based precursor (as shown in FIG. 1, n=18, X=$CH_3$) is dissolved in 7 mL of a tetrahydrofuran solvent; 0.0025 g of 2-methyl-α-[2-[[propylsulfonyl]imine]-3(2H)-thiophen-methylene-phenylacetonitrile (PAG103) is added; after uniformly stirring, a mixed liquid is sprayed to form a film on a substrate; the substrate is placed under a 405 nm and 2 mW/cm$^2$ light-emitting diode lamp for irradiating for 30 min after tetrahydrofuran is completely evaporated; then the substrate is placed in 10 mL of an N,N-DMF solution having 0.02 mol/L of 4,4,4-trifluoro-1-butanol for undergoing a transesterification reaction for 24 h; and washing and drying are performed to obtain an organosilicone micro-mesoporous ultra-low dielectric thin film. See Table 1 for the result.

Embodiment 4

At a room temperature, 0.5 g of a POSS-based precursor (as shown in FIG. 1, n=18, X=$CH_3$) is dissolved in 7 mL of a tetrahydrofuran solvent; 0.0025 g of 2-methyl-α-[2-[[propylsulfonyl]imine]-3(2H)-thiophen-methylene-phenylacetonitrile (PAG103) is added; after uniformly stirring, a mixed liquid is sprayed to form a film on a substrate; the substrate is placed under a 405 nm and 2 mW/cm$^2$ light-emitting diode lamp for irradiating for 30 min after tetrahydrofuran is completely evaporated; then the substrate is placed in 10 mL of an N,N-DMF solution having 0.01 mol/L of 3,3,3-trifluoro-1-propanol for undergoing a transesterification reaction for 48 h; and washing and drying are performed to obtain an organosilicone micro-mesoporous ultra-low dielectric thin film. See Table 1 for the result.

Embodiment 5

At a room temperature, 0.5 g of a POSS-based precursor (as shown in FIG. 1, n=20, X=$CH_3$) is dissolved in 7 mL of a tetrahydrofuran solvent; 0.02 g of 2-methyl-α-[2-[[propylsulfonyl]imine]-3(2H)-thiophen-methylene-phenylacetonitrile (PAG103) is added; after uniformly stirring, a mixed liquid is sprayed to form a film on a substrate; the substrate is placed under a 405 nm and 5 mW/cm$^2$ light-emitting diode lamp for irradiating for 30 min after tetrahydrofuran is completely evaporated; then the substrate is placed in 10 mL of an N,N-DMF solution having 0.01 mol/L of 3,3,3-trifluoro-1-propanol for undergoing a transesterification reaction for 48 h; and washing and drying are performed to obtain an organosilicone micro-mesoporous ultra-low dielectric thin film. See Table 1 for the result.

Embodiment 6

At a room temperature, 0.3 g of a POSS-based precursor (as shown in FIG. 1, n=22, X=$CH_3$) is dissolved in 7 mL of a tetrahydrofuran solvent; 0.03 g of 2-methyl-α-[2-[[propylsulfonyl]imine]-3(2H)-thiophen-methylene-phenylacetonitrile (PAG103) is added; after uniformly stirring, a mixed liquid is sprayed to form a film on a substrate; the substrate is placed under a 405 nm and 20 mW/cm$^2$ light-emitting diode lamp for irradiating for 30 min after tetrahydrofuran is completely evaporated; then the substrate is placed in 6 mL of an N,N-DMF solution having 0.05 mol/L of 1H,1H,2H,2H-perfluorohexan-1-ol for undergoing a transesterification reaction for 72 h; and washing and drying are performed to obtain an organosilicone micro-mesoporous ultra-low dielectric thin film. See Table 1 for the result.

TABLE 1

Test results of water contact angles of organopolysiloxane superhydrophobic coatings

| Sample | Dielectric constant | Water contact angle (°) | Tensile modulus (GPa) |
|---|---|---|---|
| Embodiment 1 | 2.21 | 85 | 2.44 |
| Embodiment 2 | 2.07 | 89 | 2.47 |
| Embodiment 3 | 1.99 | 96 | 2.36 |
| Embodiment 4 | 1.89 | 94 | 2.38 |
| Embodiment 5 | 1.96 | 93 | 2.24 |
| Embodiment 6 | 2.02 | 106 | 2.18 |

Note: measurement of a dielectric constant test is implemented by using an HP4194A-type dielectric frequency spectrograph; a water contact angle test is implemented by using a DSA25-type full-automatic video contact angle measurement instrument produced by Germany Kriss company, and three parallel tests are averaged; and the tensile modulus is tested according to GB/T1040-92.

The implementations are only for describing technical concepts and features of the present invention, are for the purpose of enabling people familiar with the technology to understand and implement the content of the present invention, but are not intended to limit the scope of protection of the present invention. Equivalent variations or modifications made according to the essence of the present invention all shall fall within the scope of protection of the present invention.

The invention claimed is:

1. A preparation method for the organosilicone micro-mesoporous ultra-low dielectric thin film, wherein a structural formula of a POSS-based organosilane precursor in the thin film is as follows:

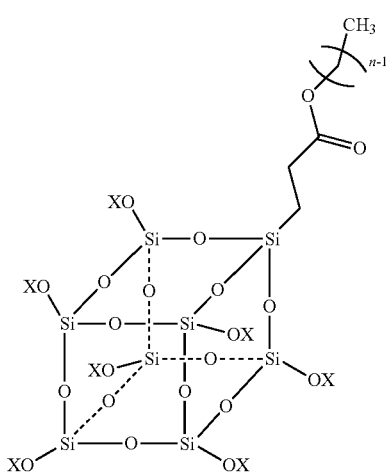

wherein n is 12, 16, 18, 20, or 22, and X is $CH_3$ or $CH_2CH_3$, comprising the following steps:

dissolving a POSS-based precursor in an organic solvent at a room temperature;

adding an appropriate amount of a photoacid generator;

after uniformly stirring, spraying a mixed liquid to form a film on a substrate;

placing the substrate under a light-emitting diode lamp for irradiating for a preset time after the organic solvent is completely evaporated; then placing the substrate in N,N-dimethylformamide for undergoing a transesterification reaction with short-chain fluoroalkyl alcohol for 24-72 h; and washing and drying to obtain the organosilicone micro-mesoporous ultra-low dielectric thin film.

2. The preparation method for the organosilicone micro-mesoporous ultra-low dielectric thin film according to claim 1, wherein the substrate is conductive glass or a silicon wafer.

3. The preparation method for the organosilicone micro-mesoporous ultra-low dielectric thin film according to claim 1, wherein a mass ratio of the POSS-based precursor to the photoacid generator is 10:0.05-1.

4. The preparation method for the organosilicone micro-mesoporous ultra-low dielectric thin film according to claim 1, wherein a molar concentration of the short-chain fluoroalkyl alcohol is 0.01-0.05 mol/L.

5. The preparation method for the organosilicone micro-mesoporous ultra-low dielectric thin film according to claim 1, wherein placing the substrate under a light-emitting diode lamp further comprises placing the substrate under a light emitting diode lamp emitting a specific wavelength of 320 nm, 365 nm, or 405 nm.

6. The preparation method for the organosilicone micro-mesoporous ultra-low dielectric thin film according to claim 1, wherein placing the substrate under a light-emitting diode lamp further comprises placing the substrate under a light emitting diode lamp having a power of 0.1-20 mW/cm².

7. The preparation method for the organosilicone micro-mesoporous ultra-low dielectric thin film according to claim 1, wherein the preset time is 30-60 min.

8. The preparation method for the organosilicone micro-mesoporous ultra-low dielectric thin film according to claim 1, wherein the photoacid generator is 4-isobutyl phenyl-4'-methyl phenyl iodohexafluorophosphate, 2-methyl-α-[2-[[propylsulfonyl]imine]-3(2H)-thiophen-methylene-phenylacetonitrile, or 4-octyloxy diphenyl iodonium hexaflurorantimonate.

9. The preparation method for the organosilicone micro-mesoporous ultra-low dielectric thin film according to claim 1, wherein the fluoroalkyl alcohol is 2,2,2-trifluoroethanol, 3,3,3-trifluoro-1-propanol, 4,4,4-trifluoro-1-butanol, or 1H,1H,2H,2H-perfluorohexan-1-ol.

* * * * *